United States Patent
Gao et al.

(10) Patent No.: US 9,450,210 B2
(45) Date of Patent: Sep. 20, 2016

(54) OPTICAL THIN FILM LAMINATE FOR ORGANIC ELECTROLUMINESCENT DISPLAY ELEMENT, PRODUCTION METHOD THEREOF, ORGANIC ELECTROLUMINESCENT DISPLAY ELEMENT AND DISPLAY DEVICE

(71) Applicant: BOE TECHNOLOGY GROUP CO., LTD., Beijing (CN)

(72) Inventors: Xue Gao, Beijing (CN); Fei Liu, Beijing (CN); Qinghui Zeng, Beijing (CN); Junran Wang, Beijing (CN); Jinlong Liao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/420,157

(22) PCT Filed: Jun. 26, 2014

(86) PCT No.: PCT/CN2014/080837
§ 371 (c)(1),
(2) Date: Feb. 6, 2015

(87) PCT Pub. No.: WO2015/085751
PCT Pub. Date: Jun. 18, 2015

(65) Prior Publication Data
US 2016/0049614 A1 Feb. 18, 2016

(30) Foreign Application Priority Data
Dec. 10, 2013 (CN) .......................... 2013 1 0673833

(51) Int. Cl.
*H01L 51/52* (2006.01)
*H01L 51/00* (2006.01)
(Continued)

(52) U.S. Cl.
CPC ......... *H01L 51/5281* (2013.01); *G02B 5/3041* (2013.01); *H01L 27/3244* (2013.01);
(Continued)

(58) Field of Classification Search
None
See application file for complete search history.

(56) References Cited

U.S. PATENT DOCUMENTS

| 2003/0062519 | A1 | 4/2003 | Yamazaki et al. |
| 2004/0031977 | A1* | 2/2004 | Brown ................ H01L 51/5237 257/222 |

(Continued)

FOREIGN PATENT DOCUMENTS

| CN | 1665361 A1 | 9/2005 |
| CN | 1918002 A | 2/2007 |

(Continued)

OTHER PUBLICATIONS

First Office Action from Chinese Patent Application No. 201310673833.X, dated Jul. 1, 2015, 7 pages.
(Continued)

*Primary Examiner* — Lex Malsawma
*Assistant Examiner* — Gardner W Swan
(74) *Attorney, Agent, or Firm* — Kinney & Lange, P.A.

(57) ABSTRACT

An organic electroluminescent display element, an optical thin film laminate and a production method thereof are disclosed. The optical thin film laminate comprises a circular polarizer film layer, a protection film layer provided on the light incidence side of the circular polarizer film layer, an adhesive layer provided on the light output side of the circular polarizer film layer, and a moisture and oxygen resistant film layer; wherein the moisture and oxygen resistant film layer is provided between the light output side of the circular polarizer film layer and the adhesive layer, and/or, between the light incidence side of the circular polarizer film layer and the protection film layer.

12 Claims, 5 Drawing Sheets

(51) Int. Cl.
   *G02B 5/30* (2006.01)
   *H01L 27/32* (2006.01)
   *H01L 51/56* (2006.01)

(52) U.S. Cl.
   CPC ......... *H01L51/004* (2013.01); *H01L 51/0094* (2013.01); *H01L 51/0097* (2013.01); *H01L 51/524* (2013.01); *H01L 51/5246* (2013.01); *H01L 51/5253* (2013.01); *H01L 51/5256* (2013.01); *H01L 51/56* (2013.01); *H01L 2251/301* (2013.01); *H01L 2251/303* (2013.01); *H01L 2251/5338* (2013.01); *Y02E 10/549* (2013.01); *Y02P 70/521* (2015.11)

(56) References Cited

U.S. PATENT DOCUMENTS

| | | | |
|---|---|---|---|
| 2005/0194896 A1* | 9/2005 | Sugita | B82Y 20/00 313/506 |
| 2007/0145889 A1* | 6/2007 | Tamura | H01L 51/5281 313/504 |
| 2008/0012151 A1* | 1/2008 | Kemppainen | H01L 51/0021 257/786 |
| 2008/0157655 A1 | 7/2008 | Choi et al. | |
| 2012/0319572 A1* | 12/2012 | Lee | H01L 51/524 313/512 |
| 2013/0032830 A1* | 2/2013 | Lee | G02B 5/3041 257/88 |
| 2014/0332786 A1* | 11/2014 | Nakazawa | G02B 5/3025 257/40 |

FOREIGN PATENT DOCUMENTS

| | | |
|---|---|---|
| CN | 1988206 A | 6/2007 |
| CN | 102832352 A | 12/2012 |
| CN | 102916034 A | 2/2013 |
| CN | 103682155 A | 3/2014 |
| WO | 2013077220 A1 | 5/2013 |

OTHER PUBLICATIONS

Translation of Written Opinion from PCT Application Serial No. PCT/CN2014/080837, 2 pages.
International Search Report in Chinese dated Aug. 25, 2014 for PCT/CN2014/080837.
Chinese Office Action and English translation dated Dec. 21, 2015, for corresponding Chinese Application No. 201310673833.X.
Third Chinese Office Action for Chinese Patent Application No. 201310673833.X, dated Jun. 2, 2016.

\* cited by examiner

OPTICAL THIN FILM LAMINATE FOR ORGANIC ELECTROLUMINESCENT DISPLAY ELEMENT, PRODUCTION METHOD THEREOF, ORGANIC ELECTROLUMINESCENT DISPLAY ELEMENT AND DISPLAY DEVICE

TECHNICAL FIELD

The present invention relates to display technical field, especially to an optical thin film laminate for an organic electroluminescent display element, a production method thereof, an organic electroluminescent display element and a display device.

BACKGROUND

Currently, the organic electroluminescent display (OLED) element have gradually become the mainstream in the display field, because they have the characteristics such as fast response, wide color gamut, super thinness, capability of being flexible and the like, comparing with the traditional liquid crystal display (LCD) element.

The structure of an OLED element mainly comprises a base substrate, and an organic electroluminescent pixel array formed on the base substrate; wherein each organic electroluminescent pixel array comprises an anode and a cathode disposed oppositely, and a light emitting layer between the anode and the cathode. The light emission of the OLED element is achieved by causing electrons generated in the cathode and holes generated in the anode to be recombined in the light emitting layer so as to excite the organic material in the light emitting layer to emit light. However, in an OLED display element, the organic material used for the light emitting layer and the active metal used for the cathode are very sensitive to moisture and oxygen, therefore, OLED elements require higher technical support than other display elements in terms of encapsulation. If the encapsulation of the OLED element is not fast, moisture and oxygen may penetrate inside the display from the surrounding environment, causing the oxidation of the cathode metal and the deterioration of the organic material of the light emitting layer, such that the lifetime of the OLED element is shorten, or it directly causes the fatal damage of the element so as to influence the application thereof.

Currently, in small or middle sized OLED elements, an encapsulating manner of glass cover plate is predominant. For flexible or large sized OLED elements, the current method mainly comprises simply encapsulating the OLED element with a thin film, and then adhering a moisture and oxygen resistant protection film. Moreover, in order to reduce the reflection of the ambient light by the OLED display element which reduces the contrast and visibility of the display, a circular polarizer should also be adhered after the adhesion of the moisture and oxygen resistant film. The structural schematic diagram is shown by FIG. 1, comprising a base substrate 1, an organic electroluminescent pixel array 2, an encapsulating thin film 3, a moisture and oxygen resistant protection film 4, and a circular polarizer 5.

As seen from the above, the current encapsulating method for a flexible or a large sized OLED element requires a duple film adhering, which may bring the problems such as complicated process, increased cost, and the duple film adhering may also increase the thickness of the flexible element, resulting in the problem of the difficulty in rolling.

SUMMARY

Embodiments of the present invention provide an optical thin film laminate for an organic electroluminescent display element, a production method thereof, an organic electroluminescent display element, and a display device, for solving the problems of complicated process, increased cost, and the difficulty in rolling the flexible OLED element caused by the duple film adhering in the current organic electroluminescent display elements.

Embodiments of the present invention provide an optical thin film laminate for an organic electroluminescent display element, comprising: a circular polarizer film layer, a protection film layer provided on the light incidence side of the circular polarizer film layer, an adhesive layer provided on the light output side of the circular polarizer film layer, and a moisture and oxygen resistant film layer, wherein, the moisture and oxygen resistant film layer is provided between the circular polarizer film layer and the adhesive layer, and/or between the circular polarizer film layer and the protection film layer.

Herein, the light incidence side of the circular polarizer film layer means that, the circular polarizer film layer may prevent the light entered from the light incidence side and transmitted through the circular polarizer film layer from emitting out of the light incidence side after being reflected and transmitted through the circular polarizer film layer again. More specifically, when it is used in an organic electroluminescent display element, the light incidence side of the circular polarizer film is the side on which the ambient light irradiates on the circular polarizer film. Moreover, the light output side of the circular polarizer film layer is the side thereof opposite to the light incidence side.

The above described optical thin film laminate provided by embodiments of the present invention comprises a protection film layer, a circular polarizer film layer, and a moisture and oxygen resistant film layer and an adhesive layer; because this optical thin film laminate comprises a circular polarizer film layer and a moisture and oxygen resistant film layer, it may have both anti reflection function and good moisture and oxygen resistant property. When such dual functional optical thin film laminate is applied to OLED element, it may not only solve the problems of complicated process, increased cost, and the difficulty in rolling the flexible OLED element caused by the duple film adhering; but also bring advantages such as being more thin and lightweight, better display effect and the like to the OLED element.

Preferably, in the above described optical thin film laminate provided by embodiments of the present invention, the circular polarizer film layer comprises a phase difference film layer and a polarizing functional film layer, wherein, the phase difference film layer is the light output side of the circular polarizer film layer, and the polarizing functional film layer is the light incidence side of the circular polarizer film layer.

Preferably, in the above described optical thin film laminate provided by embodiments of the present invention, the moisture and oxygen resistant film layer comprises any one or a combination of:

an inorganic material film layer;
an inorganic-organic material hybrid film layer;
an inorganic material film layer/organic material film layer/inorganic material film layer laminate;
an inorganic-organic material hybrid film layer/organic material film layer/inorganic-organic material hybrid film layer laminate; and
an inorganic material film layer/organic material film layer/inorganic-organic material hybrid film layer laminate.

Preferably, in order to facilitate the practice, in the above described optical thin film laminate provided by embodiments of the present invention, the material of the inorganic material film layer is alumina, titania, silicon nitride, or silicon carbide.

Preferably, in order to facilitate the practice, in the above described optical thin film laminate provided by embodiments of the present invention, the material of the organic material film layer is poly(methyl methacrylate).

Preferably, in order to facilitate the practice, in the above described optical thin film laminate provided by embodiments of the present invention, the material of the inorganic-organic material hybrid film layer is the product of the reaction between hexamethyldisiloxane (HMDSO) and $O_2/N_2O$.

Preferably, in the above described optical thin film laminate provided by embodiments of the present invention, the material of the adhesive layer is a pressure sensitive adhesive (PSA).

Preferably, in order to facilitate the practice, in the above described optical thin film laminate provided by embodiments of the present invention, it further comprises a releasing layer provided on the side of the adhesive layer opposite to the circular polarizer film layer.

Preferably, in order to facilitate the practice, the material of the above described releasing layer is selected from a polyethylene releasing film, a polyethylene terephthalate releasing film, an aligned polypropylene releasing film, a polycarbonate releasing film, a polystyrene barrier film, a poly(methyl methacrylate) releasing film, a biaxial stretched polypropylene releasing film, a 4-methyl-1-pentene resin releasing film, a polyvinyl chloride releasing film, a polytetrafluoroethylene releasing film, a monosilicon releasing thin film, a polyphenylene oxide releasing film, and the like. The releasing layer may is high temperature resistant, and may be a composite releasing film composed of two or more materials.

Embodiments of the present invention provide an organic electroluminescent display element, comprising a base substrate, an organic electroluminescent pixel array provided on the base substrate, and an encapsulating thin film coated over the outside of the organic electroluminescent pixel array;

any optical thin film laminate provided by embodiments of the present invention as described above is further disposed on the light output side of the organic electroluminescent display element, the optical thin film laminate being adhered through the adhesive layer thereof onto the light output side of the organic electroluminescent display element.

In the above described organic electroluminescent display element provided by embodiments of the present invention, because the optical thin film laminate has both the function of anti reflection and good moisture and oxygen resistance, the above described organic electroluminescent display element only needs one time of film adhering process for solving the problem that an OLED element is required to adhere both a moisture and oxygen resistant film layer and a circular polarizer film layer thereon. Therefore, the difficulty of production process for the OLED element is reduced, and the OLED element also has advantages such as being more thin and lightweight, lower cost, better display effect, and the like; for a flexible OLED element, it may also avoid the difficulty in rolling caused by a greater thickness of the element.

Preferably, in the above described organic electroluminescent display element provided by embodiments of the present invention, the encapsulating thin film is the light output side of the organic electroluminescent display element, and the optical thin film laminate is adhered onto the encapsulating thin film; or the base substrate is the light output side of the organic electroluminescent display element, and the optical thin film laminate is adhered onto the base substrate.

Embodiments of the present invention provide a display device comprising the above described organic electroluminescent display element provided by embodiments of the present invention.

Embodiments of the present invention provide a production method of any optical thin film laminate as described above, comprising:

forming the moisture and oxygen resistant film layer by employing a roll-to-roll process or a sheet production process;

forming the adhesive layer by employing a coating method;

forming the protection film layer by employing a roll-to-roll process or a sheet production process.

Preferably, the above described production method provided by embodiments of the present invention further comprises, after the adhesive layer is formed, forming a releasing layer by employing a roll-to-roll process or a sheet production process.

DETAILED DESCRIPTION

Figure 1:
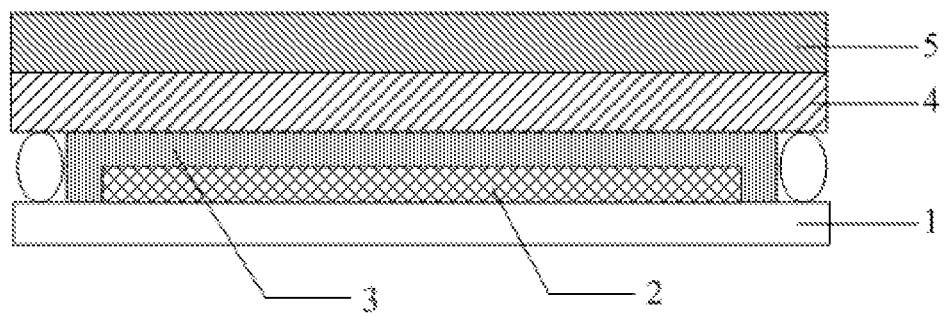
FIG. 1 is the structural schematic diagram of an organic electroluminescent display element in the prior art.

Specific embodiments of the optical thin film laminate for an organic electroluminescent display element, the production method thereof, the organic electroluminescent display element, and the display device provided by the present invention are described in details below in combination with the drawings.

Among other things, the thicknesses of respective film layers in the drawings do not represent the real ratio in the optical thin film laminate and the organic electroluminescent display element, and the purpose is only the illustration of the contents of the invention.

Figure 2A:
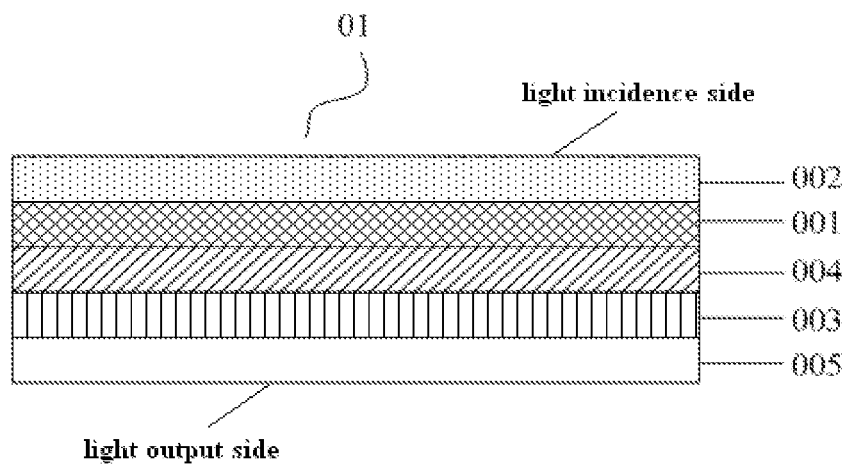
FIGS. 2a to 2c are structural schematic diagrams of optical thin film laminates provided by embodiments of the present invention, respectively.
Figure 2B:
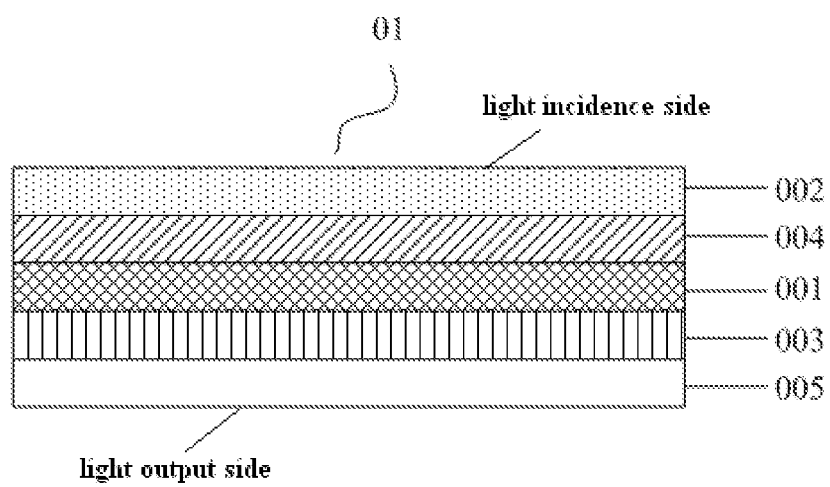
Figure 2C:
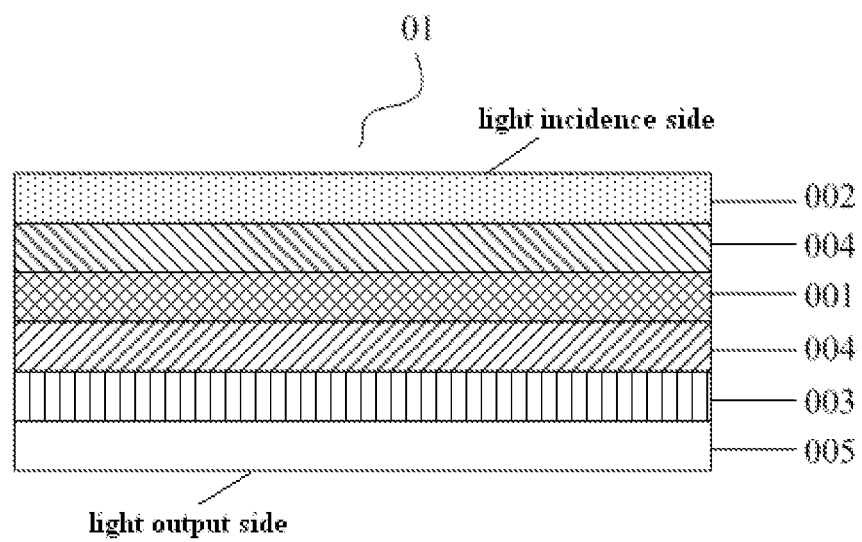

The optical thin film laminate 01 for an organic electroluminescent display element provided by embodiments of the present invention, as shown by FIGS. 2a to 2c, comprises: a circular polarizer film layer 001, a protection film layer 002 disposed on the light incidence side of the circular polarizer film layer 001, an adhesive layer 003 disposed on the light output side of the circular polarizer film layer 001, and a moisture and oxygen resistant film layer 004; wherein, the moisture and oxygen resistant film layer 004 is disposed between the circular polarizer film layer 001 and the adhesive layer 003, and/or, between the light incidence side of the circular polarizer film layer 001 and the protection film layer 002.

It should be noticed that, the light incidence side of the circular polarizer film layer 001 herein means the side of the circular polarizer film layer 001 to which the ambient light irradiates. The above described optical thin film laminate provided by embodiments of the present invention comprises a protection film layer, a circular polarizer film layer, a moisture and oxygen resistant film layer, and an adhesive layer; because this optical thin film laminate comprises a circular polarizer film layer and a moisture and oxygen resistant film layer, it may have both the anti reflection function and good moisture and oxygen resistance, and when the dual functional optical thin film laminate is applied in an OLED element, it may not only solve the problems of complicated process, increased cost due to duple film adhering, but also avoid the problem of rolling difficulty caused by the increase of the thickness of the flexible OLED element due to duple film adhering; meanwhile it may bring advantages such as being more thin and lightweight, better display effect, and the like to the OLED element.

Specifically, in the above described optical thin film laminate provided by embodiments of the present invention, the circular polarizer film layer mainly functions to block the reflected light. The circular polarizer film layer may employ an existing circular polarizer, and may be dispensed with a supporting film (TAC), such that it may mainly comprise a phase difference film layer and a polarizing functional film layer; wherein, the phase difference film layer is the light output side of the circular polarizer film layer, and the polarizing functional film layer is the light incidence side of the circular polarizer film layer.

Specifically, the main function of the polarizing functional film layer is for transforming natural light passing through the polarizing functional film layer into a linear polarized light; the phase difference film layer is preferably a quarter wavelength retardation plate, whose main function is for transforming the linear polarized light passed into a circularly polarized light, or transforming the circularly polarized light passed into a linear polarized light. By combining the polarizing functional film layer and the phase difference film layer, nature light incidence comes from the polarizing functional film layer, and is transferred into a linear polarized light upon passing the polarizing functional film layer. Then the linear polarized light is transferred from the linear polarized light into a levorotatory circularly polarized light after passing through the phase difference film layer. Then, when the levorotatory circularly polarized light is reflected back it is transferred into a dextral circularly polarized light, which passes through the phase difference film layer again, transferring from a dextral circularly polarized light into a linear polarized light. The linear polarized light at this time is vertical to the previous linear polarized light, and cannot pass through the linear polarizer, such that the reflected light cannot pass through this polarizing functional film layer, thereby the influence of the ambient light is reduced and the contrast is improved.

Moreover, in the above described optical thin film laminate provided by embodiments of the present invention, the material of the polarizing functional film layer may be poly(vinyl alcohol) (PVA), and may also be carbon nanotubes (CNT), which is not specifically limited herein. Preferably, because carbon nanotubes have self-supporting function, employing carbon nanotubes for producing the polarizing functional film layer of the circular polarizer film layer may omit the production of the supporting film layer.

Preferably, in the above described optical thin film laminate provided by embodiments of the present invention, as shown by FIG. 2a, a moisture and oxygen resistant film layer 004 is preferably provided between the light output side of the circular polarizer film layer 001 and the adhesive layer 003, such that when the above described optical thin film laminate is applied into OLED element, the distance between the moisture and oxygen resistant film layer and the organic electroluminescent pixel array in the OLED element is shorter, such that it may better exert the moisture and oxygen protection function for the organic electroluminescent pixel array.

Of course, for a specific practice, in the above described optical thin film laminate provided by embodiments of the present invention, as shown by FIG. 2b, a moisture and oxygen resistant film layer 004 may also be provided between the light incidence side of the circular polarizer film layer 001 and the protection film layer 002, which is not limited herein.

It should be noticed that, if the moisture and oxygen resistant film layer 004 is closer to the protection film layer 002, that is, when the above described optical thin film laminate 01 is applied into an OLED element, a moisture and oxygen resistant film layer 004 is further away from the organic electroluminescent pixel array in the OLED element, then the moisture and oxygen protection effect for the organic electroluminescent pixel array is weaker, therefore, when in a specific design of the optical thin film laminate 01, the moisture and oxygen resistant film layer 004 should be provided closed to the adhesive layer 003 as much as possible.

Preferably, in order to further achieve moisture and oxygen protection effect for the organic electroluminescent pixel array, multiple moisture and oxygen resistant film layers 004 may be provided in the above described optical thin film laminate provided by embodiments of the present invention. As shown by FIG. 2c, moisture and oxygen resistant film layers 004 may be provided both between the light output side of the circular polarizer film layer 001 and the adhesive layer 003, and between the light incidence side of circular polarizer film layer 001 and the protection film layer 002. In this way, it may have double effect of moisture and oxygen protection for the organic electroluminescent pixel array in the OLED element, but this will also increase the total thickness of the OLED element, therefore, the required layer number of the moisture and oxygen resistant film layers may be set according to the practical requirements.

Moreover, in the above described optical thin film laminate provided by embodiments of the present invention, as shown by FIG. 2c, when moisture and oxygen resistant film layers 004 are provided on the both sides of the circular polarizer film layer 001, the structures of the moisture and oxygen resistant film layers 004 on two sides of the circular polarizer film layer 001 may be the same, and may also be different, which is not limited herein.

Figure 3A:
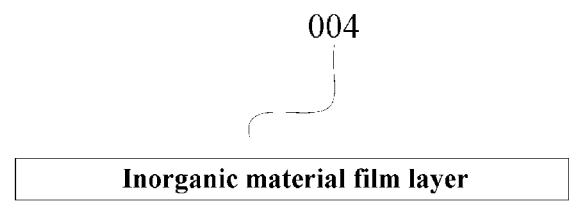
FIGS. 3a to 3g are structural schematic diagrams of moisture and oxygen resistant film layers provided by embodiments of the present invention, respectively.
Figure 3B:
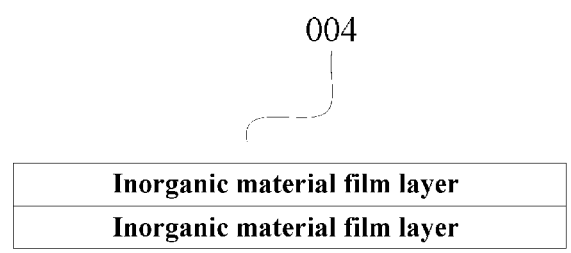
Figure 3C:
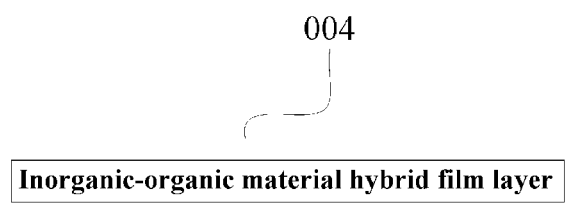
Figure 3D:
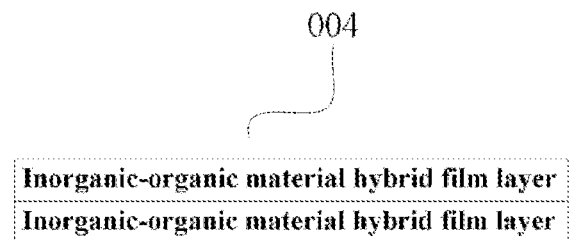
Figure 3E:
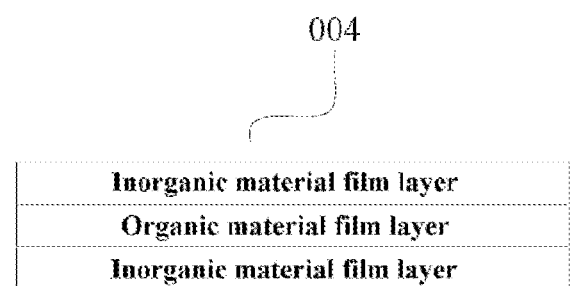
Figure 3F:
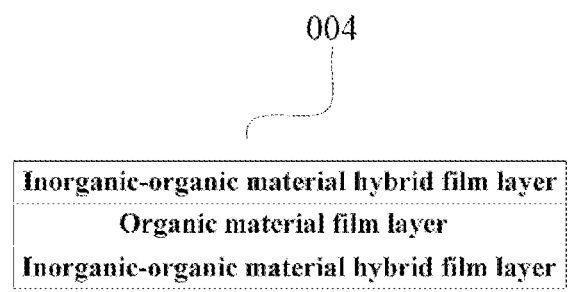
Figure 3G:
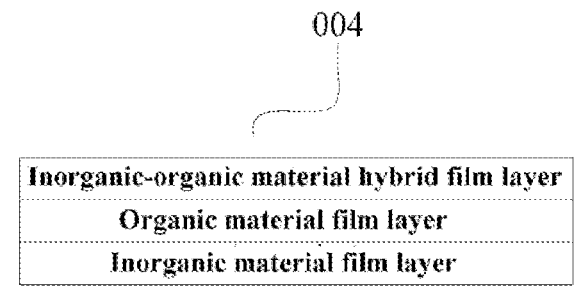

Preferably, in the above described optical thin film laminate provided by embodiments of the present invention, the moisture and oxygen resistant film layer may specifically comprise any one or a combination of:

an inorganic material film layer, as shown by FIGS. 3a and 3b;

an inorganic-organic material hybrid film layer, as shown by FIGS. 3c and 3d;

an inorganic material film layer/organic material film layer/inorganic material film layer laminate, as shown by FIG. 3e;

an inorganic-organic material hybrid film layer/organic material film layer/inorganic-organic material hybrid film layer laminate, as shown by FIG. 3f; and an inorganic material film layer/organic material film layer/inorganic-organic material hybrid film layer laminate, as shown by FIG. 3g.

Moreover, in the above described optical thin film laminate provided by embodiments of the present invention, when the structure of the moisture and oxygen resistant film layer comprises multiple inorganic material film layers, the materials of the respective inorganic material film layers may be the same, and may also be different, which is not limited herein.

Also, in the above described optical thin film laminate provided by embodiments of the present invention, when the structure of the moisture and oxygen resistant film layer comprises multiple inorganic-organic material hybrid film layers, the materials of the respective inorganic-organic material hybrid film layers may be the same, or may also be different, which is not limited herein.

Specifically, the material of the above described inorganic material film layer may be specifically alumina, titania, silicon nitride, or silicon carbide. Of course, it may also be another inorganic material capable of achieving the solution of the invention, which is not limited herein. The thickness of the inorganic material film layer is preferably from 10 nm to 1 μm.

Specifically, the material of the above described organic material film layer may be poly(methyl methacrylate). Of course, it may also be another organic material capable of achieving the solution of the invention, which is not limited herein. The thickness of the organic material film layer is preferably form 1 to 5 μm.

Specifically, the material of the above described inorganic-organic material hybrid film layer is a mixture of silica and a silicon-carbon long chain compound. Of course, it may also be another organic inorganic hybrid material capable of achieving the solution of the invention, which is not limited herein. The thickness of the inorganic-organic material hybrid film layer is preferably from 1 to 2.5 μm.

Preferably, in the above described optical thin film laminate provided by embodiments of the present invention, the material of the adhesive layer is PSA.

Preferably, before the optical thin film laminate is applied into OLED element, in the above described optical thin film laminate provided by embodiments of the present invention, as shown by FIGS. 2a to 2c, it may also comprise a releasing layer 005 on the light output side of the adhesive layer 003 opposite to the circular polarizer film layer 001, in order to protect the adhesive layer. In this way, before such optical thin film laminate is applied into OLED element, the releasing layer may protect the adhesive layer. When such optical thin film laminate is applied into OLED element, the releasing layer is peeled off, such that the optical thin film laminate is directly adhered onto the OLED element by the adhesive layer.

Figure 4A:
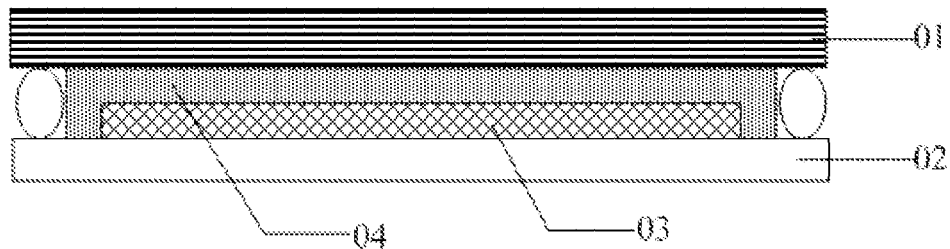
FIG. 4a and FIG. 4b are structural schematic diagrams of organic electroluminescent display elements provided by embodiments of the present invention, respectively.
Figure 4B:
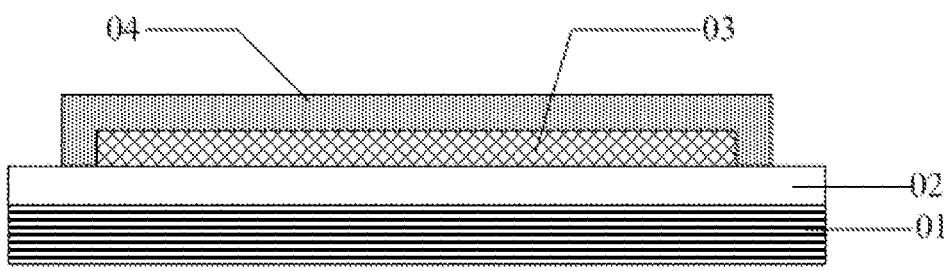

Based on the same inventive conception, embodiments of the present invention also provide an organic electroluminescent display element, as shown by FIGS. 4a and 4b, which comprises a base substrate 02, an organic electroluminescent pixel array 03 provided on the base substrate 02, an encapsulating thin film 04 coated over the outside of the organic electroluminescent pixel array 03. Any optical thin film laminate 01 provided by embodiments of the present invention as described above is further provided on the light output side of the organic electroluminescent display element, the adhesive layer in the optical thin film laminate 01 being adhered onto the light output side of the organic electroluminescent display element.

In the above described organic electroluminescent display element provided by embodiments of the present invention, because the optical thin film laminate has the dual functions of anti reflection and good moisture and oxygen resistance, the above described organic electroluminescent display element only needs one time of film adhering process for solving the problem that an OLED element is required to adhere both the moisture and oxygen resistant film layer and the circular polarizer film layer. Therefore, difficulty of the production process of the OLED element is reduced, and the OLED element also has advantages such as being more thin and lightweight, lower cost, better display effect, and the like; for a flexible OLED element, it may also avoid the difficulty in rolling caused by a greater thickness of the element.

Specifically, in the above described organic electroluminescent display element provided by embodiments of the present invention, as shown by FIG. 4a, the encapsulating thin film 04 is the light output side of the organic electroluminescent display element, that is, the light emitting type of this organic electroluminescent display element is a top emission type, and an optical thin film laminate 01 is adhered onto the encapsulating thin film 04; or, as shown by FIG. 4b, the base substrate 02 is the light output side of the organic electroluminescent display element, that is, the light emitting type of this organic electroluminescent display element is bottom emission type, and the optical thin film laminate 01 is adhered onto the base substrate 02.

Moreover, in the above described organic electroluminescent display element provided by embodiments of the present invention, the organic electroluminescent pixel array may comprise a plurality of organic electroluminescent structures composed of an anode, a cathode, and a light emitting layer located between the anode and the cathode. Specifically, the specific structure of the organic electroluminescent pixel array is the prior art, which will not be repeated herein.

Based on the same inventive conception, embodiments of the present invention also provide a display device, comprising the above described organic electroluminescent display element provided by embodiments of the present invention. Because the principle for solving the problem by this display device is similar to the previous described organic electroluminescent display element, the implement of this display device may follow the previously described implement of the organic electroluminescent display element, which will not be repeated herein.

Figure 5:
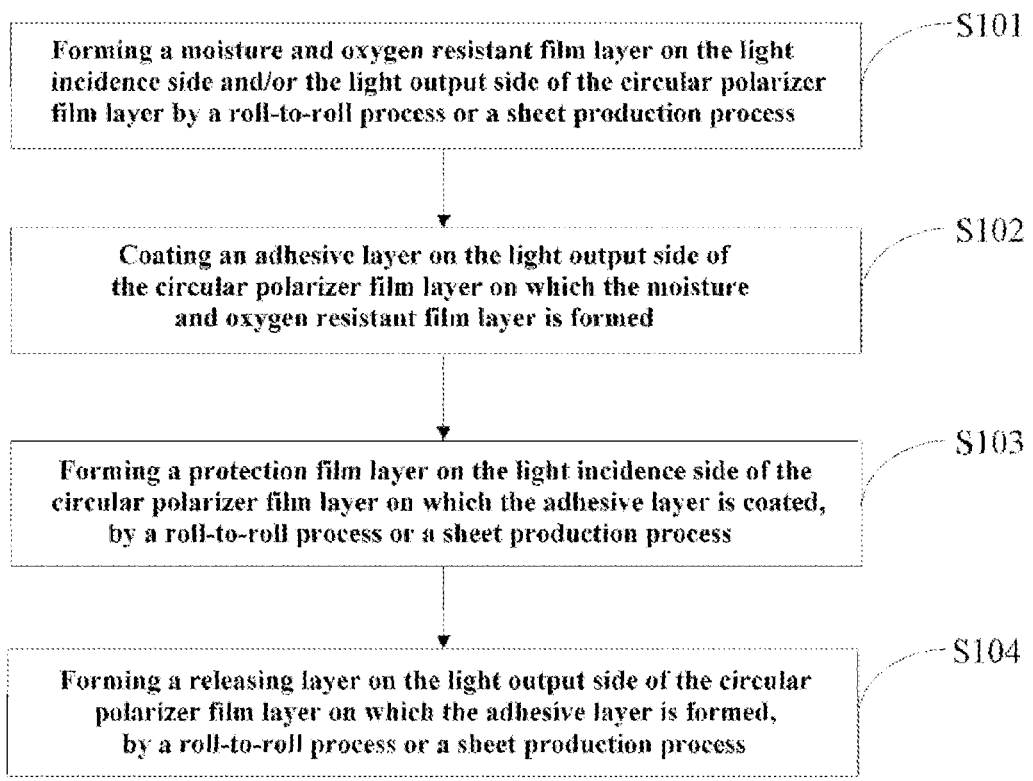
FIG. 5 is the flow chart of the production method of the optical thin film laminate provided by embodiments of the present invention.
Figure 6:
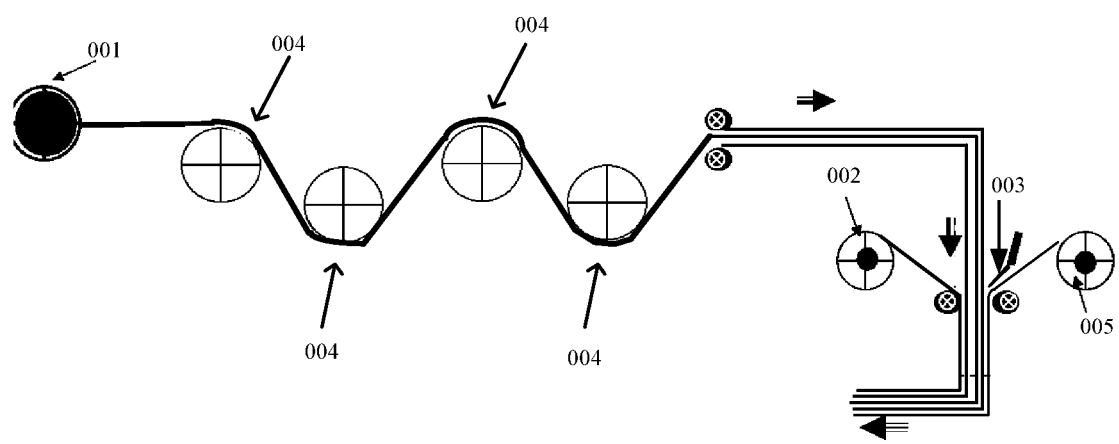
FIG. 6 is the schematic diagram of the roll-to-roll process in the optical thin film laminate production method provided by embodiments of the present invention.

Based on the same inventive conception, embodiments of the present invention also provide a production method of any optical thin film laminate as described above. One embodiment is shown by FIG. 5, which specific comprises the following steps:

S101, forming a moisture and oxygen resistant film layer 004 on the light incidence side and/or light output side of the circular polarizer film layer 001 by employing a roll-to-roll process or a sheet production process, wherein the schematic diagram of the specific procedure of the roll-to-roll process employed is shown by FIG. 6. FIG. 6 is only illustrated by the example of forming 4 layers of the moisture and oxygen resistant film layer 004. In the specific practice, the number of reels should be set according to the specific structural arrangement of the moisture and oxygen resistant film layer 004. Unnecessary details are not given herein.

Specifically, for forming an inorganic material film layer, a depositing manner may be employed. For forming an organic material film layer, a printing manner may be employed. Of course, the specific forming manner of the moisture and oxygen resistant film layer is not limited thereto.

S102, coating an adhesive layer 003 on the light output side of the circular polarizer film layer 001 on which the moisture and oxygen resistant film layer 004 is formed, the schematic diagram of the specific process thereof being shown by FIG. 6;

S103, forming a protection film layer 002 on the light incidence side of the circular polarizer film layer 001 on which the adhesive layer 003 is coated, by employing a roll-to-roll process or a sheet production process, wherein the schematic diagram of the specific process of the roll-to-roll process employed is shown by FIG. 6.

Particularly, in the specific practice, the protection film layer may also be formed in another manner capable of achieving the embodiment of the invention, which is not limited herein.

The above is only one embodiment of the method of the invention. The forming order of each film layer is not specially limited, provided that it may finally form the optical thin film laminate of the invention.

Preferably, in the above described production method provided by embodiments of the present invention as shown by FIG. 5, it may further comprise a step S104: after forming the adhesive layer 003, forming a releasing layer 005 on the light output side of the circular polarizer film layer 001 on which the adhesive layer 003 is formed, by employing a roll-to-roll process or a sheet production process. The schematic diagram of the specific process employing a roll-to-roll process is shown by FIG. 6.

Specifically, in the specific practice, the releasing layer may also be formed in another manner capable of achieving the solution of the invention, which is not limited herein.

Preferably, in the above described production method provided by embodiments of the present invention, steps S103 and S104 may be carried out separately, and may also be carried out at the same time, that is, forming a protection film layer and a releasing layer on two sides of the circular polarizer film layer at the same time by employing a roll-to-roll process, wherein the releasing layer is formed on the side of the circular polarizer film layer on which the adhesive layer is formed, and the protection film layer is formed on the other side of the circular polarizer film layer. The schematic diagram of the specific process thereof is shown by FIG. 6.

Example 1

As shown by FIG. 6, the method for producing the multifunctional film laminate as shown by FIG. 2a employing a roll-to-roll manner comprised the following steps.

Firstly, a circular polarizer film layer 001 rolled on a reel was unrolled, and then, a moisture and oxygen resistant film layer 004 was produced on the light output side of the circular polarizer film layer employing the prior art process. FIG. 6 shows four reels 004, but this is only illustrative, not limitative. The multifunctional film laminate of FIG. 2a only had one moisture and oxygen resistant film layer, so only one reel 004 was needed. The desired number of reel 004 is determined according to the number of film layers to be produced.

Finally, on the light incidence side of the circular polarizer film layer provided with the moisture and oxygen resistant function, a protection film layer 002 was formed by a roller; and on the light output side of the circular polarizer film layer provided with the moisture and oxygen resistant function, an adhesive layer 003 and a releasing layer 005 were formed by a roller.

Embodiments of the present invention provide an optical thin film laminate for an organic electroluminescent display element, a production method thereof, an organic electroluminescent display element and a display device. The optical thin film laminate comprises a circular polarizer film layer, a protection film layer provided on the light incidence side of the circular polarizer film layer, an adhesive layer provided on the light output side of the circular polarizer film layer, and a moisture and oxygen resistant film layer; wherein, the moisture and oxygen resistant film layer is provided between the circular polarizer film layer and the adhesive layer, and/or, between the circular polarizer film layer and the protection film layer. Because this optical thin film laminate comprises a circular polarizer film layer and a moisture and oxygen resistant film layer, it may have both the anti-reflection function and good moisture and oxygen resistance. When the dual functional optical thin film laminate is applied into an OLED element, it may not only solve the problems of complicated process, increased cost due to duple film adhering, but also avoid the difficulty of rolling the flexible OLED element caused by the increase of the thickness thereof due to duple film adhering; meanwhile it may bring advantages such as being more thin and light-weight, better display effect, and the like to the OLED element.

Obviously, various modifications and alternatives can be made to the invention by a person skilled in the art without departing from the spirit and scope of the present invention. In this way, if these modifications and alternatives of the present invention fall into the scope of the claims of the application and the equivalents thereof, the present invention also intends to include these modifications and alternatives.

The invention claimed is:

1. An optical thin film laminate for an organic electroluminescent display element, comprising:
   a circular polarizer film layer, a protection film layer provided on an ambient light incidence side of the circular polarizer film layer, an adhesive layer provided on an ambient light output side of the circular polarizer film layer, and a moisture and oxygen resistant film layer;
   wherein, the moisture and oxygen resistant film layer is provided between the circular polarizer film layer and the adhesive layer, and/or, between the circular polarizer film layer and the protection film layer;
   wherein, the moisture and oxygen resistant film layer comprises any one or a combination of:
      an inorganic-organic material hybrid film layer;
      a laminate formed by laminating an inorganic-organic material hybrid film layer, an organic material film layer, and an inorganic-organic material hybrid film layer in this order; and
      a laminate formed by laminating an inorganic material film layer, an organic material film layer, and an inorganic-organic material hybrid film layer in this order; and wherein the inorganic-organic material hybrid film layer is a mixture of silica and a silicon-carbon long chain compound formed as a product of a reaction between hexamethyldisiloxane and $O_2/N_2O$.

2. The optical thin film laminate according to claim 1, wherein, the circular polarizer film layer comprises a phase difference film layer and a polarizing functional film layer, wherein, the phase difference film layer is the ambient light output side of the circular polarizer film layer, and the polarizing functional film layer is the ambient light incidence side of the circular polarizer film layer.

3. The optical thin film laminate according to claim 1, wherein the moisture and oxygen resistant film layer comprises the inorganic material film layer which is composed of alumina, titania, silicon nitride or silicon carbide.

4. The optical thin film laminate according to claim 1, wherein the moisture and oxygen resistant film layer comprises the organic material film layer which is composed of poly(methyl methacrylate).

5. The optical thin film laminate according to claim 1, wherein the adhesive layer is composed of a pressure sensitive adhesive.

6. The optical thin film laminate according to claim 1, further comprising: a releasing layer provided on the side of the adhesive layer opposite to the circular polarizer film layer.

7. An organic electroluminescent display element, comprising a base substrate, an organic electroluminescent pixel array provided on the base substrate, and an encapsulating thin film coated overt the outside of the organic electroluminescent pixel array, wherein
    a light output side of the organic electroluminescent display element is further provided with the optical thin film laminate according to claim 1, wherein the optical thin film laminate is adhered through the adhesive layer thereof to the light output side of the organic electroluminescent display element.

8. The organic electroluminescent display element according to claim 7, wherein,
    the encapsulating thin film is the light output side of the organic electroluminescent display element, and the optical thin film laminate is adhered onto the encapsulating thin film; or
    the base substrate is the light output side of the organic electroluminescent display element, and the optical thin film laminate is adhered onto the base substrate.

9. A display device, comprising the organic electroluminescent display element according to claim 7.

10. A display device, comprising the organic electroluminescent display element according to claim 8.

11. A production method of the optical thin film laminate according to claim 1, comprising forming on the circular polarizer film layer,
    the moisture and oxygen resistant film layer by employing a roll-to-roll process or a sheet production process;
    the adhesive layer by employing a coating process; and
    the protection film layer by employing a roll-to-roll process or a sheet production process.

12. The production method according to claim 11, further comprising:
    upon forming the adhesive layer, forming a releasing layer by employing a roll-to-roll process or a sheet production process.

* * * * *